United States Patent
Kim et al.

(10) Patent No.: US 12,334,173 B2
(45) Date of Patent: Jun. 17, 2025

(54) MEMORY DEVICE INCLUDING FLEXIBLE COLUMN REPAIR CIRCUIT

(71) Applicant: Samsung Electronics Co., Ltd., Suwon-si (KR)

(72) Inventors: Hyungjin Kim, Suwon-si (KR); Seunghyun Cho, Suwon-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 81 days.

(21) Appl. No.: 18/296,640

(22) Filed: Apr. 6, 2023

(65) Prior Publication Data

US 2024/0006013 A1 Jan. 4, 2024

(30) Foreign Application Priority Data

May 13, 2022 (KR) .................. 10-2022-0059182
Jun. 29, 2022 (KR) .................. 10-2022-0080000

(51) Int. Cl.
*G11C 29/44* (2006.01)
*G06F 11/10* (2006.01)

(52) U.S. Cl.
CPC ...... *G11C 29/4401* (2013.01); *G06F 11/1044* (2013.01)

(58) Field of Classification Search
CPC ..... G11C 29/785; G11C 29/846; G11C 29/24; G11C 29/787; G11C 29/027; G11C 29/812; G11C 29/70; G11C 29/4401; G06F 11/2094; G06F 11/1044
See application file for complete search history.

(56) References Cited

U.S. PATENT DOCUMENTS

| | | | |
|---|---|---|---|
| 5,999,463 A | 12/1999 | Park et al. | |
| 6,137,157 A | 10/2000 | Proebsting | |
| 6,445,628 B1 | 9/2002 | Pereira et al. | |
| 6,834,016 B2 | 12/2004 | Kato et al. | |
| 7,111,193 B1 | 9/2006 | Hsieh et al. | |
| 7,415,640 B1 | 8/2008 | Zorian et al. | |
| 9,368,229 B2 | 6/2016 | Ko | |
| 2008/0049526 A1 | 2/2008 | Jung et al. | |
| 2019/0227886 A1* | 7/2019 | Glancy | G06F 11/1048 |
| 2019/0304565 A1* | 10/2019 | Kim | G11C 29/781 |
| 2020/0160896 A1* | 5/2020 | Kwak | G11C 7/222 |
| 2021/0295945 A1* | 9/2021 | Bassa | G11C 29/24 |

FOREIGN PATENT DOCUMENTS

| | | |
|---|---|---|
| KR | 20030094684 A | 12/2003 |
| KR | 20070038672 A | 4/2007 |
| KR | 100855961 B1 | 9/2008 |

* cited by examiner

*Primary Examiner* — Cynthia Britt
(74) *Attorney, Agent, or Firm* — Myers Bigel, P.A.

(57) ABSTRACT

A memory device includes a memory cell array having a plurality of memory cells therein that span a plurality of rows, which are grouped into segments, and a plurality of columns, which are grouped into ticks. The ticks include normal ticks, and a spare tick that spans at least one redundancy column of memory cells in the memory cell array. A repair circuit is provided, which is configured to: (i) repair a first source address of a first failed column, which spans a plurality of the segments, with a first destination address of a pass column in one of the normal ticks, and then (ii) further repair the first destination address of the pass column with a first redundancy column within the spare tick that corresponds to the first destination address.

20 Claims, 16 Drawing Sheets

400a

| S_ADDR | | D_ADDR | |
|---|---|---|---|
| 300 | 0 | 0 | 1 | 1 |
| 301 | 0 | 1 | 1 | 1 |

Anti-fuse 610

MEMORY DEVICE INCLUDING FLEXIBLE COLUMN REPAIR CIRCUIT

REFERENCE TO PRIORITY APPLICATIONS

This application claims priority to Korean Patent Application Nos. 10-2022-0059182, filed May 13, 2022, and 10-2022-0080000, filed Jun. 29, 2022, the disclosures of which are hereby incorporated herein by reference.

BACKGROUND

The inventive concept relates to semiconductor memory devices, and more particularly, to memory devices that support flexible column repair, and support reductions in the size of a fuse array that stores failed addresses.

Semiconductor chips are manufactured through a semiconductor manufacturing process and then tested by test equipment at the level of: wafers, dies, or packaged chips. A fail part or a fail chip is selected through a test, and when some memory cells fail, a repair operation is performed on failed cells to rescue a semiconductor chip. In semiconductor chips, such as dynamic random access memory (DRAM), as fine processing continues, the possibility of errors occurring in the manufacturing process increases. In addition, even when a fail cell is not detected in the initial test stage, an error may occur during operation of the chip.

For stable and fast real-time processing of large-capacity data, the demand for high-capacity DRAM is increasing. However, the performance quality of DRAM may change over time. Memory systems may expect reliability, availability, and serviceability (RAS) functions with respect to DRAM. Accordingly, any DRAM may be configured to perform test and repair operations on a memory cell array (MCA), provide a test pattern for detecting a failed cell in the MCA, and repair a failed memory cell in the MCA as a redundancy memory cell.

In addition, a fail address detected in the test may be stored in a nonvolatile memory (e.g., a fuse array) in the DRAM, and a repair operation may be performed on the fail address. When a plurality of fuses are used to store the fail address, a proportionally large number of fuses may be required according to the number of fail addresses, and a fuse array space to store the fail address may be insufficient. Therefore, when a part of the fuse array may be shared and reused in the repair operation, a RAS expectation may be satisfied using the limited fuse array resource. In addition, the size of the fuse array may be minimized.

SUMMARY

The inventive concept provides a memory device having a flexible column repair circuit therein, in which a part of a fuse array is shared and reused in order to reduce the size of the fuse array.

According to an aspect of the inventive concept, there is provided a memory device for accessing data corresponding to a burst length (BL) including a memory cell array. This memory device includes a plurality of memory cells, which are disposed at intersections of a plurality of rows and a plurality of columns. The memory cell array divides the plurality of rows into segments and the plurality of columns into ticks. The ticks include normal ticks corresponding to burst data of the BL in each of the segments and a spare tick that is configured to repair a failed column of the normal ticks with a redundancy column. A repair circuit is provided, which firstly repairs a first source address of a first failed column generated in each of the segments with a first destination address of a pass column in a first normal tick in which the first failed column is generated, and further repairs the first destination address with a first redundancy column of the spare tick corresponding to the first destination address. In some embodiments, the repair circuit performs a repair operation of storing a first source-destination (SD) flag signal related to the first source address and the first destination address, generating a second SD flag signal based on a column address applied to the memory device and the first source address, determining whether the first and second SD flag signals match with each other, and replacing the first failed column with the first redundancy column.

According to another aspect of the inventive concept, there is provided a memory device for accessing data corresponding to a burst length (BL), which includes a memory cell array having a plurality of memory cells therein that are disposed at intersections of a plurality of rows and a plurality of columns. The memory cell array divides the plurality of rows into segments and the plurality of columns into ticks. The ticks include normal ticks, which correspond to burst data of the BL in each of the segments and a spare tick that repairs a failed column of the normal ticks with a redundancy column. A repair circuit is provided, which firstly repairs a first source address of a first failed column generated in each of the segments with a first destination address of a pass column in a first normal tick in which the first failed column is generated, and further repairs the first destination address with a first redundancy column of the spare tick corresponding to the first destination address. Advantageously, the repair circuit performs a repair operation of storing a first source-destination (SD) flag signal related to the first source address and the first destination address, generating a second SD flag signal based on a column address applied to the memory device, the first source address, and a flag signal related to the first source address, determining whether the first and second SD flag signals match with each other, and replacing the first failed column with the first redundancy column.

According to another aspect of the inventive concept, there is provided a memory device for accessing data corresponding to a burst length (BL). The memory device includes a memory cell array having a plurality of memory cells therein, which are disposed at intersections of a plurality of rows and a plurality of columns. The memory cell array divides the plurality of rows into segments and the plurality of columns into ticks. The ticks include normal ticks corresponding to burst data of the BL in each of the segments, and a spare tick that is configured to repair a failed column of the normal ticks with a redundancy column. A repair circuit is provided for: (i) storing a first source-destination (SD) flag signal indicating a mapping relationship between a first source address of a first failed column generated in each of the segments and a first destination address of a pass column in a first normal tick in which the first failed column is generated, and (ii) storing a second SD flag signal indicating that a second source address of a second failed column generated in the first normal tick is mapped to the first destination address. The repair circuit firstly repairs the first and second source addresses with the first destination address, and then further repairs the first destination addresses respectively with the first and second redundancy columns of the spare tick corresponding to the first destination address.

According to a further aspect of the inventive concept, method of operating a memory device is provided, which includes repairing a column of memory cells in a memory cell array having a plurality of rows grouped into multiple segments and a plurality of columns grouped into multiple normal ticks and a spare tick that spans at least one redundancy column of memory cells within the memory cell array, by performing a source-destination repair (SD) operation. This SD operation includes: (i) replacing a first failed column of memory cells at a first source address within a first one of the normal ticks with a pass column at a first destination address within the first one of the normal ticks; and then (ii) further repairing the pass column at the first destination address with a first redundancy column within the spare tick.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
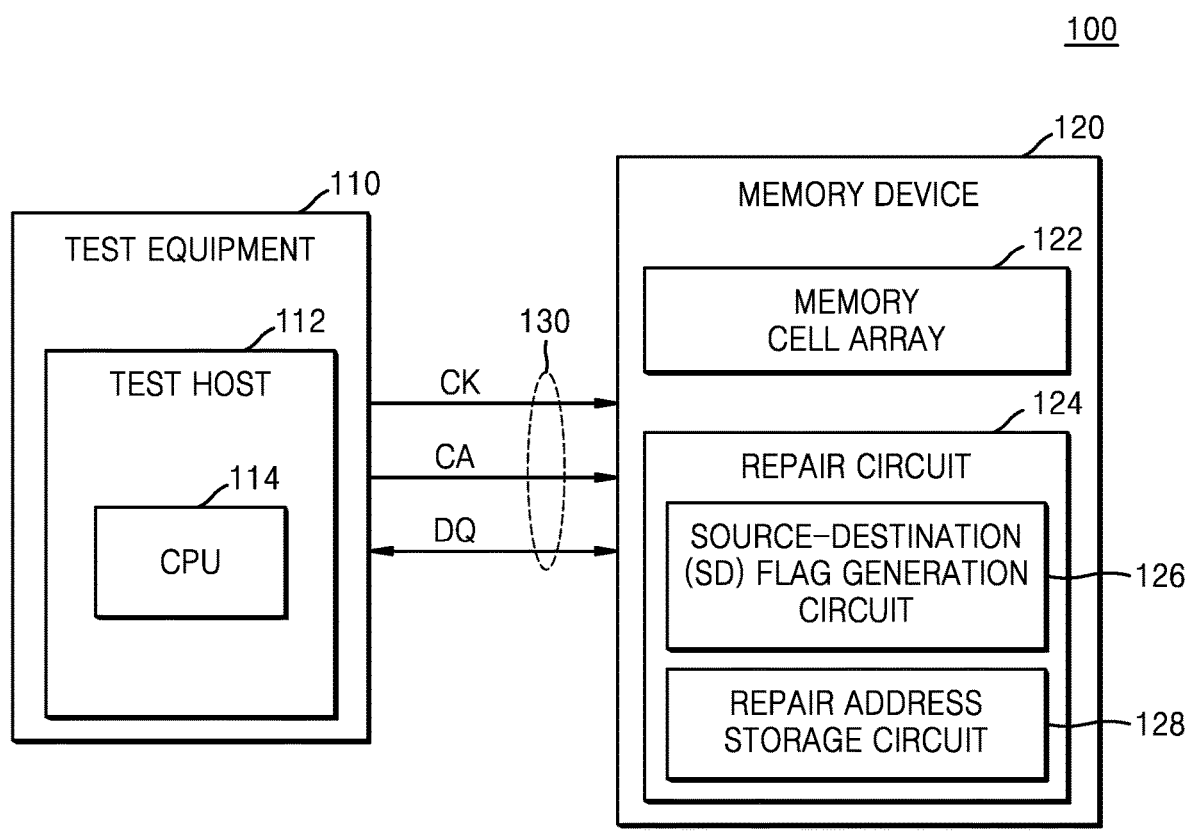
FIG. 1 is a diagram conceptually illustrating a test system that tests a memory device according to some embodiments.

FIG. 1 is a diagram conceptually illustrating a test system that tests a memory device according to some embodiments. As shown, this test system 100 includes test equipment 110 for testing a memory device 120 therein. The test equipment 110 may include a test host 112 that tests the memory device 120, which is a device under test (DUT). The test host 112 may include a central processing unit (CPU) 114 that controls hardware, software, and firmware to perform a test operation on the memory device 120. The test host 112 may transmit a test signal of the CPU 114 to the memory device 120 or may transmit a result of the memory device 120 obtained by performing the test operation based on the test signal to the CPU 114.

The test host 112 may be implemented as a test program. A test program may include a test algorithm or pattern for performing the test operation. For example, the test host 112 may store specific data in a storage region of the DUT, such as in a memory cell array 122 of the memory device 120, and may read the specific data, and determine pass/fail of the DUT according to whether the test operation is pass/fail. The test host 112 may measure changes in voltage/current/frequency under various driving conditions of the memory device 120 to test whether the changes are within an allowable range.

The memory device 120 may be implemented as DRAM, but is not limited thereto. For example, the memory device 120 may correspond to Double Data Rate Synchronous Dynamic Random Access Memory (DDR SDRAM), Low Power Double Data Rate (LPDDR) SDRAM, Graphics Double Data Rate (GDDR) SDRAM, Rambus Dynamic Random Access Memory (RDRAM), etc. Alternatively, the memory device 120 may be implemented as static RAM (SRAM), high bandwidth memory (HBM), or processor-in-memory (PIM). In other embodiments, the memory device 120 may be implemented as a nonvolatile memory device. For example, the memory device 120 may be implemented as a flash memory or a resistive memory such as phase change RAM (PRAM), magnetic RAM (MRAM), resistive RAM (RRAM), etc.

The test host 112 may test the memory device 120 through a channel 130. The channel 130 may include a bus that physically or electrically connects the test host 112 to the memory device 120. For example, a clock CK is received by the memory device 120 through a clock bus, a command and address CA is received by the memory device 120 through a command/address bus, and data DQ may be provided between the test host 112 and the memory device 120 through a data bus. For the brevity of the drawings, signals are shown as being transmitted through one signal line between the test host 112 and the memory device 120. Nonetheless, each bus may typically include one or more signal lines to which signals are provided.

The test host 112 may provide a command to the memory device 120 to test a memory operation. Non-limiting examples of a memory command may include a timing command for controlling the timing of various operations, an access command for accessing a memory, such as a read command for performing a read operation and a write command for performing a write operation, etc.

During the test, when the write command and a related address are provided to the memory device 120 by the test host 112, the memory device 120 may receive the write command and the related address, perform a write operation, and store write data received from the test host 112 at a memory location corresponding to the related address. The write data is provided to the memory device 120 by the test host 112 according to the timing related to reception of the write command. For example, the timing may be based on a write latency (WL) value indicating the number of clock cycles after the write command when the write data is provided to the memory device 120 by the test host 112. The WL value may be programmed into a mode register set (MRS) of the memory device 120 by the test host 112. As is known, the MRS of the memory device 120 may be programmed as information for selecting features for setting various operating modes and/or for selecting features for the memory operation.

During the test, when the read command and a related address are provided to the memory device 120 by the test host 112, the memory device 120 may receive the read command and the related address, perform a read operation, and output read data from a memory location corresponding to the related address. The read data may be provided to the test host 112 by the memory device 120 according to timing related to reception of the read command. For example, the timing may be based on a read latency (RL) value indicating the number of clock cycles after the read command when the read data is provided to the test host 112 by the memory device 120. The RL value may be set in the memory device 120 by the test host 112. For example, the RL value may be programmed to the MRS of the memory device 120.

The test host 112 may detect a fail address during the test and provide the detected fail address to the memory device 120. The test host 112 may store the fail address in a nonvolatile memory (e.g., a fuse array) in the memory device 120 and instruct the memory device 120 to perform a repair operation on the fail address. The memory device 120 may perform the repair operation by replacing a failed word line selected by the fail address with a redundancy word line, or by replacing a failed bit line selected by the fail address with a redundancy bit line.

The memory device 120 may include the memory cell array 122 and a repair circuit 124. The memory cell array 122 may include a plurality of rows (or word lines), a plurality of columns (or bit lines), and a plurality of memory cells formed at intersections of the rows and columns. A memory cell of the memory cell array 122 may be a volatile memory cell, for example, a DRAM cell. In addition, the memory cell array 122 may include redundancy rows and/or redundancy columns to which redundancy memory cells for repairing a fail memory cell are connected when an unrepairable defect or fail occurs in the memory cell.

Figure 2:
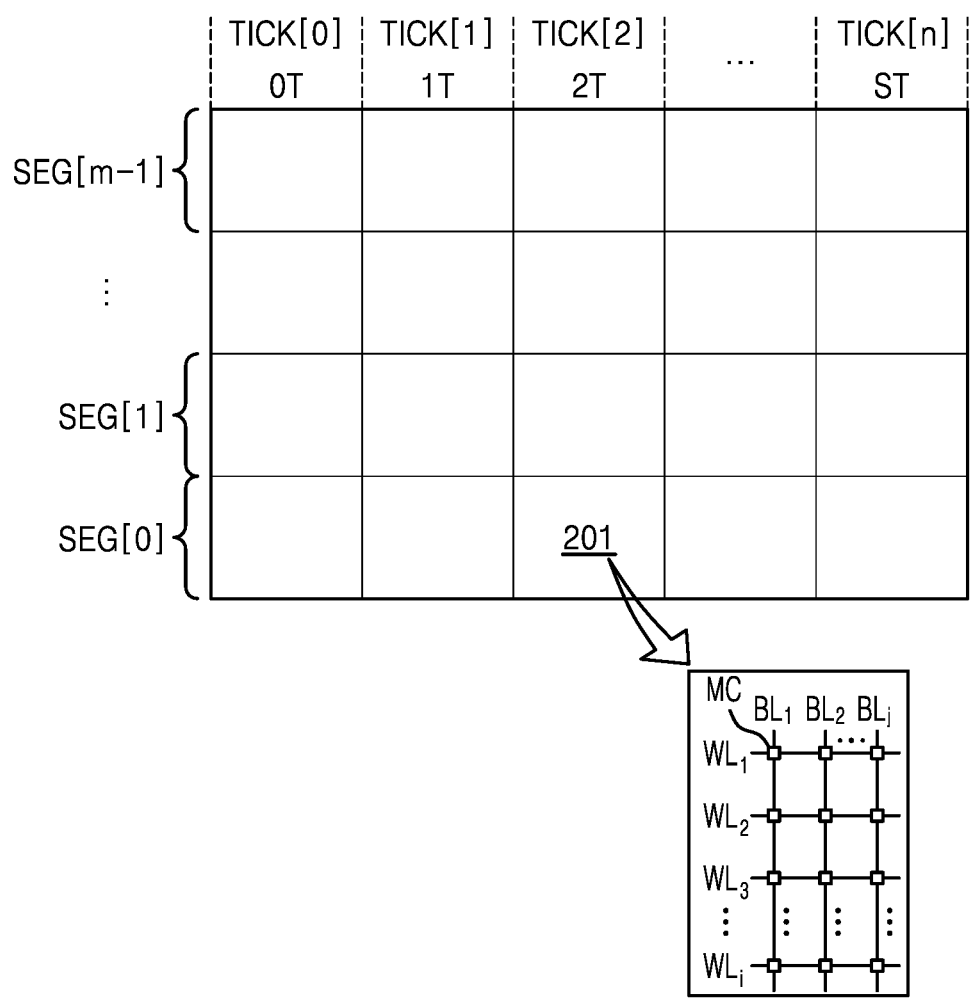
FIGS. 2 and 3 are diagrams illustrating a column repair method according to some embodiments.

According to some embodiments, the memory cell array 122 may include the rows divided into segments and columns divided into ticks, as shown in FIG. 2. The ticks may include normal ticks corresponding to burst data of a burst length in each of the segments and a spare tick, which repairs a failed column of normal ticks with a redundancy column.

The repair circuit 124 may be configured to repair failed memory cells detected in the memory cell array 122 with redundant memory cells. The repair circuit 124 may repair fail cells detected through an EDS test after a semiconductor manufacturing process of the memory device 120. Also, the repair circuit 124 may perform a post package repair (PPR) operation of repairing fail memory cells generated during a package/module/mounting test of the memory device 120 with redundancy memory cells.

The repair circuit 124 may include a source-destination (SD) flag generation circuit 126 and a repair address storage circuit 128 to repair failed columns detected in the memory cell array 122 with redundancy columns.

According to some embodiments, the repair circuit 124 may initially repair a first source address of a first failed column generated in each of the segments of the memory cell array 122 with a first destination address of a pass column in a first normal tick in which the first failed column is generated, and then further repair the first source address with a first redundancy column of a spare tick corresponding to the first destination address.

According to some embodiments, the repair circuit 124 may perform a repair operation of storing a first SD flag signal related to the first source address and the first destination address, generating a second SD flag signal, based on a column address applied to the memory device 120 and the first source address, determining whether the first and second SD flag signals match with each other, and replacing the first failed column with the first redundancy column.

According to some embodiments, the repair circuit 124 may perform the repair operation of storing the first SD flag signal related to the first source address and the first destination address, generating the second SD flag signal, based on a column address applied to the memory device 120, the first source address, and a flag signal related to the first source address, determining whether the first and second SD flag signals match with each other, and replacing the first failed column with the first redundancy column.

According to some embodiments, the repair circuit 124 may store the first SD flag signal indicating a mapping relationship between the first source address and the first destination address of the pass column in the first normal tick in which the first failed column is generated, store the second SD flag signal indicating that a second source address of a second failed column generated in the first normal tick is mapped to the first destination address, firstly repair the first and second source addresses with the first destination address, and then further repair the first and second source addresses respectively with the first and second redundancy columns of the spare tick corresponding to the first destination address.

Figure 3:
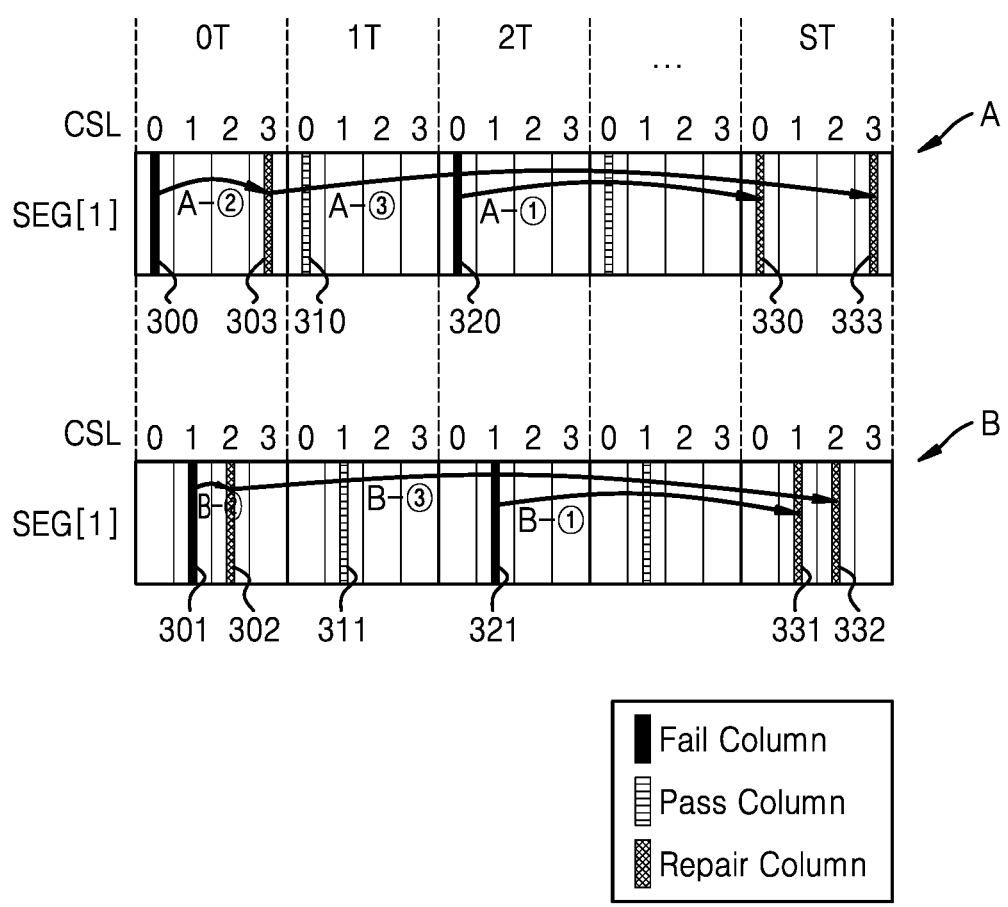

FIGS. 2 and 3 are diagrams illustrating a column repair method according to some embodiments. FIG. 2 illustrates a structure of the memory cell array 122 of FIG. 1 in row and column directions, and FIG. 3 shows failed column types generated in, for example, a SEG[1] segment among a plurality of segments SEG[0] to SEG[m−1] of FIG. 2.

Referring to FIG. 2, the memory cell array 122 may be divided into m (m is a natural number) segments SEG[0] to SEG[m−1] in the row direction, and divided into n+1 (n is a natural number) ticks TICK[0] to TICK[n] in the column direction. The memory cell array 122 may include a plurality of sub-arrays 201 divided into segments and ticks, and each of the plurality of sub-arrays 201 may include a plurality of word lines $WL_1$ to $WL_i$ and a plurality of bit lines $BL_1$ to $BL_j$. The plurality of memory cells MC may be located at intersections of the word lines WL1 to WLi and the bit lines BL1 to BLj.

In each of the segments SEG[0] to SEG[m−1], the n ticks TICK[0] to TICK[n−1] among the n+1 ticks TICK[0] to TICK[n] may be configured to store burst data corresponding to a burst length BL set in the memory device 120. In addition, the remaining ticks TICK[n] may be configured to be used as spare ticks, which enable repair of failed columns generated in the ticks TICK[0] to TICK[n−1] to a redundancy column.

In some embodiments, when the burst length BL=16 is set, each of the segments SEG[0] to SEG[m−1] may include 17 ticks TICK[0] to TICK[16]. The tick TICK[0] may be configured to store first burst data BL0, the tick TICK[1] may be configured to store second burst data BL1, and the tick TICK[15] may be configured to store last burst data BL15. In addition, the additional tick TICK[16] may be configured to be used as a spare tick for repairing a failed bit line generated in one or more of the 16 ticks TICK[0] to TICK[15]. For convenience of description, the tick TICK[0] in which burst data BL0 is stored may be referred to as a tick 0T, the tick TICK[1] in which burst data BL1 is stored may be referred to as a tick 1T, the tick TICK[2] in which burst data BL2 is stored may be referred to as a tick 2T, and the spare tick may be referred to as a tick ST. A tick that stores the burst data corresponding to the burst length BL may be referred to as a normal tick.

According to some embodiments, the memory cell array 122 may be configured to further include an error correction code (ECC) tick that stores an ECC generated based on a data set corresponding to the burst length BL=16. In this case, each of the segments SEG[0] to SEG[m−1] may include 18 ticks TICK[0] to TICK[17]. The ticks TICK[0] to TICK[15] may store the data set corresponding to the burst length BL=16, the additional tick TICK[16] may store the ECC, and the final tick TICK[17] may be used as the spare tick ST.

According to some embodiments, when the burst length BL=32 is set, the memory cell array 122 may be configured to include the ticks TICK[0] to TICK[15] storing a first burst length BL=16 data set and the tick TICK[16] storing the ECC with respect to the first burst length BL=16 data set, and include ticks TICK[17] to TICK[32] storing a second burst length BL=16 data set and a tick TICK[33] storing the ECC with respect to the second burst length BL=16 data set. A tick TICK[34] may be used as the spare tick ST.

As shown in FIG. 2, the memory cell array 122 may be divided into various numbers of ticks according to the burst length BL set in the memory device 120. A failed column included in each of the ticks 0T, 1T, 2T, . . . , which stores data corresponding to the burst length BL, may be repaired with a redundancy column of the spare tick ST. In order to more efficiently perform such a column repair operation, the memory cell array 122 may include various numbers of segments. For example, the memory cell array 122 may be divided into the 16 segments SEG[0] to SEG[15].

FIG. 3 shows a method of repairing failed columns generated in the SEG[1] segment among the plurality of segments SEG[0] to SEG[m−1] of FIG. 2. Each of the ticks 0T, 1T, 2T, . . . included in the segment SEG[1] stores data corresponding to the burst length BL, and the data corresponding to the burst length BL may be accessed through a bit line selected by a column selection signal CSL. The column selection signal CSL may be generated by decoding column addresses. For example, each of the ticks 0T, 1T, 2T, . . . included in the segment SEG[1] may include 4 columns (or bit lines), and the 4 columns may be designed to be selected by first to fourth column selection signals CSL0 to CSL3. According to an embodiment, the 0T, 1T, 2T, . . . may include various numbers of columns, and each of the columns may be accessed by the column selection signal CSL corresponding thereto.

For example, a first burst data set output by the first column selection signal CSL0 may be configured such that the burst data BL0 is output from a column 300 of the tick 0T, the burst data BL1 is output from a column 310 of the tick 1T, and the burst data BL2 may be output from a column 320 of the tick 2T. A second burst data set output by the second column selection signal CSL1 may be configured where the burst data BL0 is output from a column 301 of the tick 0T, the burst data BL1 is output from a column 311 of the tick 1T, and the burst data BL2 may be output from a column 321 of the tick 2T. A third burst data set output by the third column selection signal CSL2 may be configured where the burst data BL0 is output from a column 302 of the tick 0T, the burst data BL1 is output from the tick 1T, and the burst data BL2 may be output from the tick 2T. A fourth burst data set output by the fourth column selection signal CSL3 may be configured where the burst data BL0 is output from a column 303 of the tick 0T, the burst data BL1 is output from the tick 1T, and the burst data BL2 may be output from the tick 2T.

The SEG[1] segment shows a first fail type A related to the first column selection signal CSL0 and a second fail type B related to the second column selection signal CSL1 at the ticks 0T and 2T. The first fail type A includes the failed column 300 of the tick 0T and the failed column 320 of the tick 2T, and the second fail type B includes the failed column 301 of the tick 0T and the failed column 321 of the tick 2T. The failed columns 300, 320, 301, and 321 of the ticks 0T and 2T may be respectively repaired with redundancy columns 333, 330, 332, and 331 of the tick ST, using a source-destination repair operation.

In the first fail type A, when the burst data BL0 is output from the column 300 of the tick 0T, the burst data BL1 is output from the column 310 of the tick 1T, and the burst data BL2 is output from the column 320 of tick 2T in response to the first column selection signal CSL0, as a test result by the test host 112 (FIG. 1), the column 300 of the tick 0T and the column 320 of the tick 2T may be detected as failed columns. The failed column 300 of the tick 0T and the failed column 320 of the tick 2T may be finally repaired with the redundancy column 333 and the redundancy column 330 of the tick ST, respectively.

Specifically, the failed column 320 of the 2T tick may be directly repaired with the redundancy column 330 of the tick ST (A-①). The failed column 300 of the tick 0T may be firstly repaired with the pass column 303 in the tick 0T (A-②). The pass column 303 of the tick 0T repairing the failed column 300 of the tick 0T may be referred to as a repair column 303. The repair column 303 may be set to any one of pass columns in the tick 0T. The repair column 303 of the tick 0T may be further repaired to the redundancy column 333 of the tick ST (A-③). The operation A-② of repairing the failed column 300 of the tick 0T with the repair column 303 of the same tick 0T may be referred to as a source-destination repair operation. The failed column 300 corresponds to a source address of the source-destination repair operation, and the repair column 303 corresponds to the destination address. The source-destination repair operation may be used interchangeably with an SD repair operation.

In the second fail type B, when the burst data BL0 is output from the column 301 of the tick 0T, the burst data BL1 is output from the column 311 of the tick 1T, and the burst data BL2 is output from the column 321 of the tick 2T in response to the second column selection signal CSL1, as a test result by the test host 112, the column 301 of the tick 0T and the column 321 of the 2T tick may be detected as failed columns. Accordingly, the failed column 321 of the 2T tick may be directly repaired to the redundancy column 331 of the tick ST (B-①), the failed column 301 of the tick 0T may be firstly repaired with the repair column 302 in the tick 0T by the SD repair operation (B-②), and then, the repair column 302 of the tick 0T may be further repaired to the redundancy column 332 of the tick ST (B-③). The repair column 302 may be set to any one of pass columns in the tick 0T. In the present embodiment, the repair column 302 may be set to a column different from the repair column 303 set in the first fail type A.

The memory device 120 may store source-destination mapping information such that the failed columns 300 and 301 of the tick 0T are firstly repaired with the repair columns 303 and 302 of the same tick 0T. The source-destination mapping information may be stored in a repair address storage circuit 128a of FIG. 4.

Figure 4:
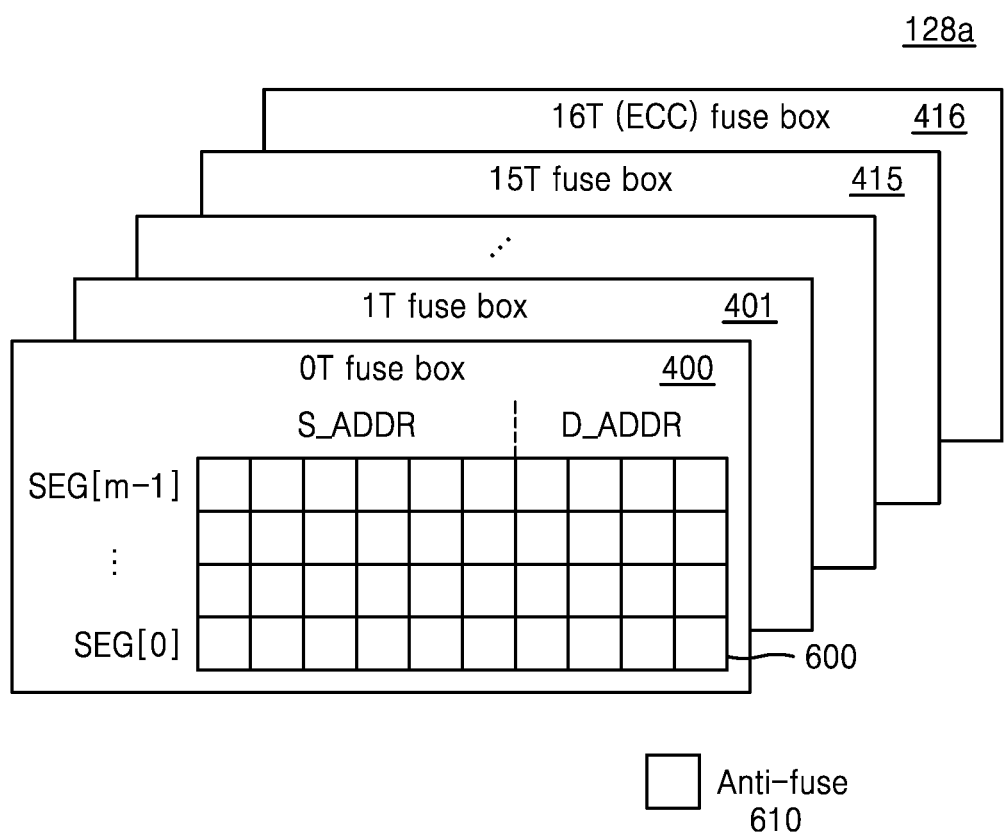
FIGS. 4 to 6 are diagrams illustrating a repair address storage circuit of FIG. 1.
Figure 5:
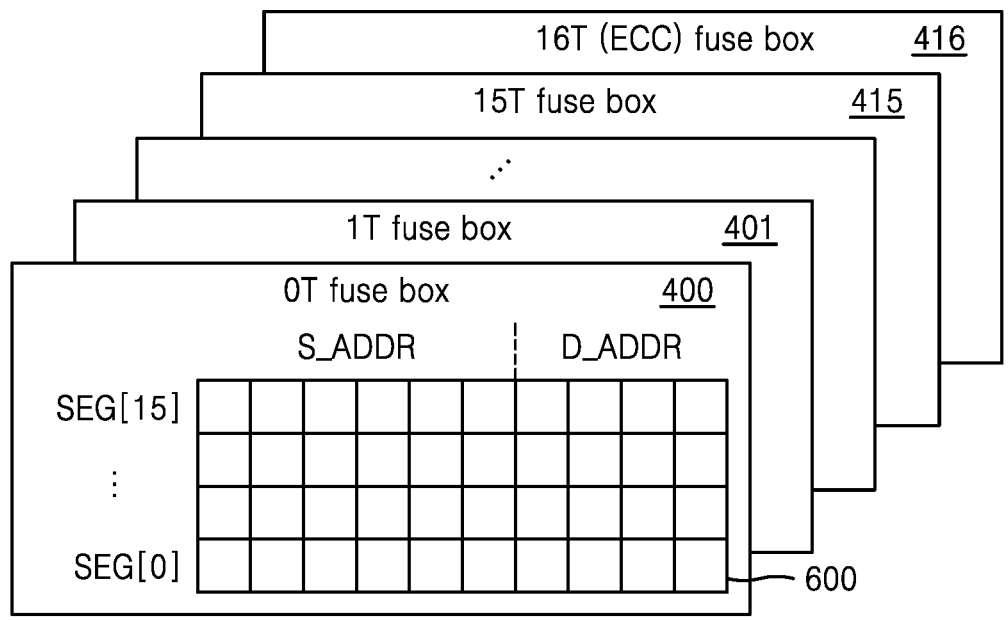
Figure 5:
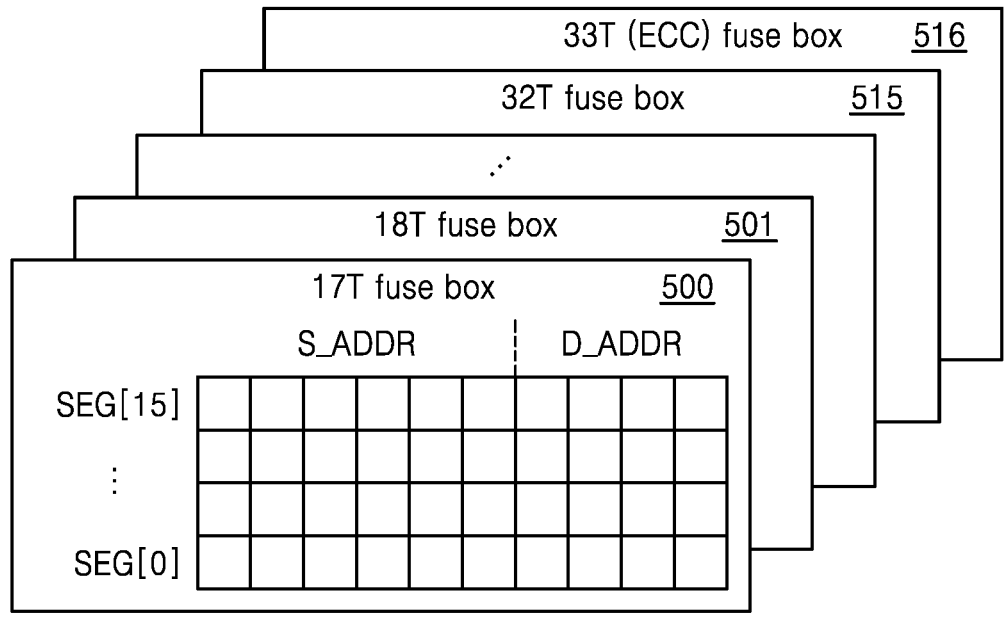
Figure 6:
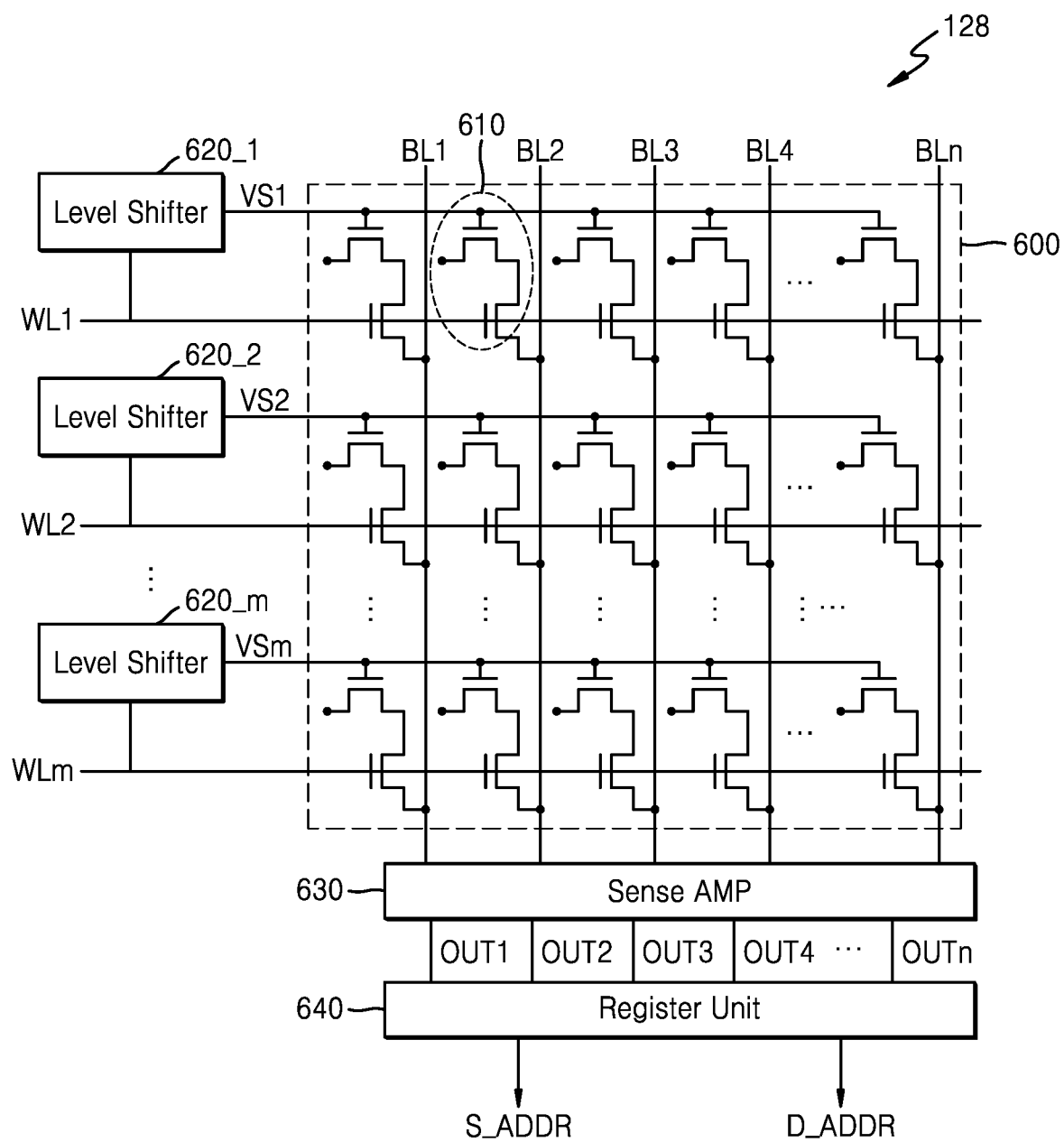

FIGS. 4 to 6 are diagrams illustrating the repair address storage circuit 128 of FIG. 1. Hereinafter, subscripts (e.g., a in 128a, b in 128b, c in 128c) attached to reference numerals are used to distinguish a plurality of circuits having the same function.

Referring to FIG. 4, when the burst length BL=16 is set, the repair address storage circuit 128a may include a plurality of fuse boxes 400 to 416. The fuse boxes 400 to 416 may be provided to store source-destination mapping information at the ticks 0T, 1T, . . . , 15T and 16T corresponding to the burst data and the ECC, with respect to an example in which each of the segments SEG[0] to SEG[m−1] is configured to store the data set of the burst length BL=16 and the ECC.

Among the plurality of fuse boxes 400 to 416, the fuse box 400 typically may store a source address addressing a failed column included in the tick 0T and a destination address addressing a repair column of the tick 0T repairing the failed column of the tick 0T in each of the segments SEG[0] to SEG[m−1]. The fuse box 401 may store a source address addressing a failed column included in the tick 1T and a destination address addressing a repair column of the tick 1T repairing the failed column of the tick 1T in each of the segments SEG[0] to SEG[m−1]. Similarly, the fuse box 415 may store a source address addressing a failed column included in the tick 15T and a destination address addressing a repair column of the tick 15T repairing the failed column of the tick 15T in each of the segments SEG[0] to SEG[m−1]. The fuse box 416 may store a source address addressing a failed column included in the tick 16T and a destination address addressing a repair column of the tick 16T repairing the failed column of the tick 16T in each of the segments SEG[0] to SEG[m−1].

In the fuse box 400, a fuse array 600 (FIG. 6) in units of 10 bits may be implemented such that a source address is stored in, for example, 6 bits and a destination address is stored in, for example, 4 bits. When the memory cell array 122 is divided into, for example, the 16 segments SEG[0] to SEG[15], the fuse box 400 may include 10*16=160 fuses 610 (FIG. 6). Accordingly, the fuse boxes 400 to 416 of the repair address storage circuit 128a may require 17*(10*16)= 2720 fuses 610 with respect to the 17 ticks 0T, 1T, . . . , 16T.

Referring to FIG. 5, when the burst length BL=32 is set, a repair address storage circuit 128b may include a plurality of fuse boxes 400 to 416 and 500 to 516. The fuse boxes 400 to 416 of a first group may be provided to store source-destination mapping information at the ticks 0T to 15T storing the first burst length BL=16 data set and at the tick 16T storing the ECC with respect to the first burst length BL=16 data set, and the fuse boxes 500 to 516 of a second group may be provided to store source-destination mapping information at ticks 17T to 32T storing the second burst length BL=16 data set and at a tick 33T storing the ECC with respect to the second burst length BL=16 data set. The repair address storage circuit 128b may require twice as many fuses, that is, 5440 fuses 610, compared to the repair address storage circuit 128a of FIG. 4.

As shown in FIG. 6, the repair address storage circuit 128 may include a fuse array 600 in which the plurality of fuses 610 are disposed, level shifters 620_1 to 620_m generating high voltages for changing resistance states of the fuses 610, and a sense amplifier 630 sensing/amplifying information stored in the fuse array 600. Also, a register unit 640 storing fuse data generated by reading the information stored in the fuse array 600 may be included in the repair address storage circuit 128.

The fuse array 600 includes the plurality of fuses 610, and information is stored in each of the fuses 610. The fuse array 600 may include a laser fuse of which connection is controlled by laser irradiation, or an electrical fuse of which connection is controlled by an electrical signal. Alternatively, the fuse array 600 may include an anti-fuse, and the anti-fuse has a characteristic in which its state transitions from a high resistance state to a low resistance state by an electrical signal (e.g., a high voltage signal). Any one of a plurality of types described above may be applied to the fuse array 600, and in the following embodiment, it is assumed that the fuse array 600 is an anti-fuse array including an anti-fuse for a source-destination address mapping operation. The fuse array 600 may be used and referred to as an anti-fuse array 600, and the fuse 610 may be used and referred to as an anti-fuse 610. Also, information stored in the anti-fuse 610 or data read from the anti-fuse 610 are referred to as fuse data.

The anti-fuse array 600 has an array structure in which the anti-fuses 610 are disposed at intersections of a plurality of rows and columns. For example, when the anti-fuse array 600 includes m rows and n columns, the anti-fuse array 600 includes m*n anti-fuses 610. The anti-fuse array 600 includes m word lines WL1 to WLm for accessing the anti-fuses 610 arranged in the m rows, and n bit lines BL1 to BLn arranged to correspond to the n columns so as to transfer information read from the anti-fuses 610.

The anti-fuse array 600 is programmed by applying voltage signals VS1 to VSm provided from the level shifters 620_1 to 620_m to the anti-fuse array 600 and changing the state of the anti-fuse 610. The anti-fuse 610 starts in a high resistance state and changes to a low resistance state by a programming operation and stores information. The anti-fuse 610 may have a structure having two conductive layers and a dielectric layer therebetween (i.e., a capacitor structure), and is programmed by applying a high voltage between the two conductive layers to thereby break the dielectric layer down.

After the anti-fuse array 600 is programmed, a read operation on the anti-fuse array 600 may be performed together with starting driving of the memory device 120. The read operation may be performed on the anti-fuse array 600 simultaneously with driving of the memory device 120, or may be performed after a pre-determined time from driving of the memory device 120. A word line selection signal may be provided through the word lines WL1 to WLm of the anti-fuse array 600, and information stored in the selected anti-fuse 610 may be provided to the sense amplifier 630 through the bit lines BL1 to BLn. Due to the characteristics of the array structure, the information of the anti-fuse array 600 may be accessed randomly by driving the word lines WL1 to WLm and the bit lines BL1 to BLn.

The sense amplifier 630 may sense, amplify and output information accessed by the anti-fuse array 600. Fuse data OUT1 to OUTn output from the sense amplifier 630 are provided to the register unit 640. The register unit 640 may receive the fuse data OUT1 to OUTn in units of rows of the anti-fuse array 600. For example, when any one row of the anti-fuse array 600 is selected, the fuse data OUT1 to OUTn from the anti-fuse 610 connected to a word line of the selected row may be provided in parallel to the register unit 640. The fuse data OUT1 to OUTn stored in the register unit 640 are information for repairing a failed column of a tick in which a fail is detected following a test, and may store a source address S_ADDR of the failed column and a destination address D_ADDR mapped to the source address S_ADDR.

Figure 7:
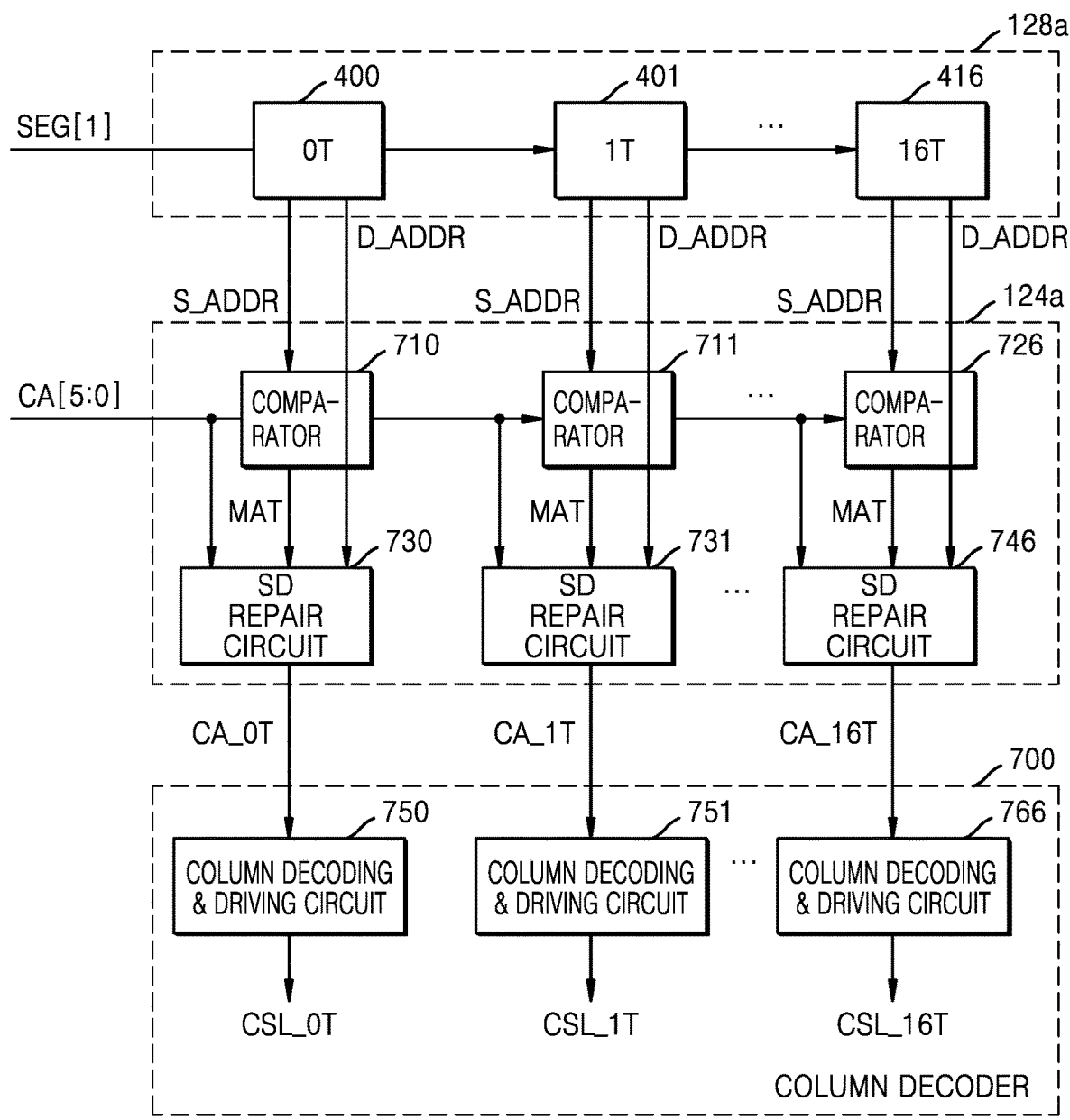
FIG. 7 is a diagram illustrating a repair circuit of FIG. 1.

FIG. 7 is a diagram illustrating the repair circuit 124 of FIG. 1. Hereinafter, subscripts (e.g., a in 124a and b in 124b) attached to the reference numerals are for distinguishing a plurality of circuits having the same function. A repair circuit 124a of FIG. 7 may perform a repair operation in combination with the repair address storage circuit 128a of FIG. 4 with respect to the segment SEG[1] described with reference to FIG. 3. In the segment SEG[1], data and ECC corresponding to the burst length BL=16 may be sequentially output at the ticks 0T, 1T, . . . , 16T.

Referring to FIG. 7, the repair circuit 124a may receive a column address CA[5:0] applied to the memory device 120. As shown in the first fail type A of FIG. 3, the source address S_ADDR indicating the failed column 300 of the tick 0T and the destination address D_ADDR indicating the repair column 303 of the tick 0T may be stored in the fuse box 400. The source address S_ADDR indicating a failed column of a corresponding tick and the destination address D_ADDR indicating a repair column of a corresponding tick may also be stored in the remaining fuse boxes 401 to 416.

The repair circuit 124a may include comparators 710, 711, . . . , 726 and source-destination repair circuits 730, 731, . . . , 746 disposed to respectively correspond to the ticks 0T, 1T, . . . , 16T. For example, each of the comparators 710, 711, and 726 may receive the column address CA[5:0] and the source address S_ADDR stored in each of the fuse boxes 400, 401, and 416 of the repair address storage circuit 128a. Each of the comparators 710, 711, and 726 may compare the column address CA[5:0] with the source address S_ADDR, and may activate or deactivate a match signal MAT according to a comparison result. Each of the comparators 710, 711, and 726 may output the activated match signal MAT when the column address CA[5:0] and the source address S_ADDR match with each other, and output the deactivated match signal MAT when the column address CA[5:0] and the source address S_ADDR do not match with each other.

For example, when the column address CA[5:0] addresses the failed column 300 of the tick 0T shown in the first fail type A of FIG. 3, the column address CA[5:0] may match the source address S_ADDR stored in the first fuse box 400. The comparator 710 may output the activated match signal MAT, and the comparators 711 and 726 may output the deactivated match signal MAT. The match signals MAT of the comparators 710, 711, and 726 may be respectively provided to the source-destination repair circuits 730, 731, and 746.

Each of the source-destination repair circuits 730, 731, and 746 may receive the match signal MAT, and perform a repair operation on the column address CA[5:0] according to whether the match signal MAT is activated. The source-destination repair circuit 730 receiving the activated match signal MAT from the comparator 710 may receive the column address CA[5:0] and the destination address D_ADDR stored in the first fuse box 400, replace the column address CA[5:0] with the destination address D_ADDR, and output the destination address D_ADDR as a specified column address CA_0T of the tick 0T. Accordingly, the source-destination repair circuit 730 may perform the repair operation on the column address CA[5:0] to the destination address D_ADDR.

On the other hand, the source-destination repair circuits 731 and 746 respectively receiving the deactivated match signal MAT from the comparators 711 and 726 do not perform the repair operation on the column address CA[5:0], and may output the column addresses CA[5:0] as specified column addresses CA_1T and CA_16T of the tick 1T and the 15T ticks. The specified column addresses CA_0T, CA_1T, and CA 16T of the source-destination repair circuits 730, 731, and 746 may be provided to a column decoder 700.

The column decoder 700 may include column decoding and driving circuits 750, 751, . . . , 766 disposed to respectively correspond to the ticks 0T, 1T, . . . , 16T. For example, the column decoding and driving circuits 750, 751, and 766 may respectively decode the specified column addresses CA_0T, CA_1T, and CA 16T and generate column selection signals CSL_0T, CSL_1T, and CSL_16T with respect to the ticks 0T, 1T, and 16T, respectively. The column selection signals CSL_0T, CSL_1T, and CSL_16T may respectively correspond to the first to fourth column selection signals CSL0 to CSL3 described with reference to FIG. 3.

In the column decoder 700, the column decoding and driving circuit 750 may decode the destination address D_ADDR of the first fuse box 400 and output the column selection signal CSL_0T. In connection with the first fail type A of FIG. 3, the column selection signal CSL_0T may correspond to the fourth column selection signal CSL3 of the tick ST. Accordingly, the failed column 300 of the tick 0T may be repaired with the redundancy column 333 of the tick ST, by generating the column selection signal CSL_0T for selecting the redundancy column 333 of the tick ST without generating the column selection signal CSL0 at the tick 0T by the column address CA[5:0] of the failed column 300.

For example, when the column address CA[5:0] addresses the failed column 301 of the tick 0T shown in the second fail type B of FIG. 3, the column address CA[5:0] matches the source address S_ADDR stored in the first fuse box 400, and thus, the comparator 710 may output the activated match signal MAT. The source-destination repair circuit 730 may receive the activated match signal MAT, replace the column address CA[5:0] with the destination address D_ADDR stored in the first fuse box 400, and output the destination address D_ADDR as the specified column address CA_0T of the tick 0T. The specified column address CA_0T is decoded by the column decoding and driving circuit 750 to output the column selection signal CSL_0T which may correspond to the third column selection signal CSL2 of the tick ST. Accordingly, the failed column 301 of the tick 0T may be repaired to the redundancy column 332 of the tick ST, by generating the column selection signal CSL_0T for selecting the redundancy column 332 of the tick ST without generating the column selection signal CSL1 at the tick 0T by the column address CA[5:0] of the failed column 301.

Figure 8:
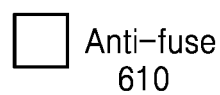
FIGS. 8 to 10 are diagrams conceptually illustrating a method of sharing a part of a fuse array in order to reduce a size of the fuse array according to some embodiments.
Figure 9:
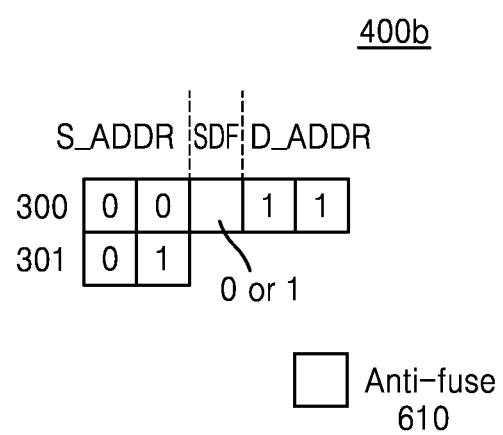
Figure 10:
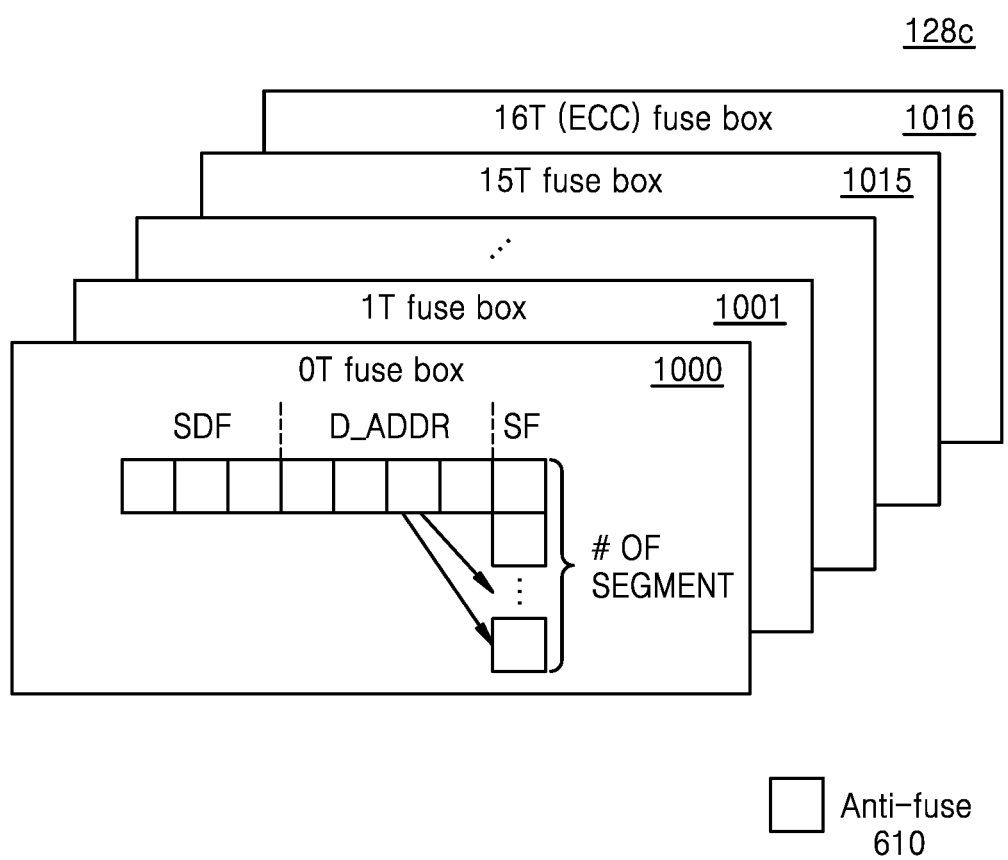

FIGS. 8 to 10 are diagrams conceptually illustrating a method of sharing a part of a fuse array in order to reduce a size of the fuse array according to some embodiments. FIGS. 8 and 9 show a fuse box 400a with respect to the tick 0T in association with FIG. 3, assuming that in the fuse box 400a with respect to the tick 0T, the source address S_ADDR with respect to the failed column 300 is, for example, bit "00", and the source address S-ADDR with respect to the failed column 301 is, for example, bit "01".

Referring to FIG. 8, the destination address D_ADDR mapped to the source address S_ADDR of bit "00" of the failed column 300 may be set to bit "11", and the destination address D_ADDR mapped to the source address S_ADDR of bit "01" of the failed column 301 may also be equally set to bit "11". The fuse box 400a may use 8 anti-fuses 610 in the anti-fuse array 600 of FIG. 6, to store mapping to the same destination address D_ADDR with respect to the source address S_ADDR of each of the different failed columns 300 and 301.

Referring to FIG. 9, a fuse box 400b may set one destination address D_ADDR to be mapped to the source address S_ADDR of each of the different failed columns 300 and 301 using a source-destination repair flag signal SDF. For example, when the source-destination repair flag signal SDF in the fuse box 400b is bit "0", the destination address D_ADDR of bit "11" may be set to be mapped to the source address S_ADDR of bit "00" of the failed column 300, and when the source-destination repair flag signal SDF is bit "1", the destination address D_ADDR of bit "11" may be set to be mapped to the source address S_ADDR of bit "01" of the failed column 301. It appears that the fuse box 400b may reduce only one anti-fuse 610 compared to the fuse box 400a of FIG. 8. However, when expanded to the memory cell array 122 entirely, the fuse box 400b may be implemented as fuse boxes 1000 to 1016 disposed to respectively correspond to the ticks 0T, 1T, . . . , 16T of a repair address storage circuit 128c shown in FIG. 10.

Referring to FIG. 10, the fuse boxes 1000 to 1016 may be provided to store source-destination mapping information at the ticks 0T, 1T, . . . , 16T corresponding to burst data and ECC of the burst length BL=16. A typical fuse box 1000 among the fuse boxes 1000 to 1016 may store the source-destination repair flag signal SDF and the destination address D_ADDR. For example, the source-destination repair flag signal SDF may be set to 2 bits, and the destination address D_ADDR may be set to 4 bits, like the destination address D_ADDR of the fuse box 400 described with reference to FIG. 4. In the fuse box 1000, one destination address D_ADDR may be shared between and mapped to seven source addresses by the source-destination repair flag signal SDF of 3 bits. In addition, a segment flag signal SF indicating which segment among the segments SEG[0] to SEG[m−1] corresponds to the source-destination repair flag signal SDF and the destination address D_ADDR may be stored in the fuse box 1000. The segment flag signal SF may be allocated by as many as the number of segments SEG[0] to SEG[m−1].

Upon calculating the anti-fuse 610 used in the fuse box 1000, 3+4+16=23 anti-fuses 610 may be used by adding 3 anti-fuses 610 storing the source-destination repair flag signal SDF of 3 bits, 4 anti-fuses 610 storing the destination address D_ADDR of 4 bits, and 16 anti-fuses 610 storing the segment flag signal SF of 1 bi. Accordingly, the fuse boxes 1000 to 1016 of the repair address storage circuit 128c may respectively require 17*23=391 anti-fuses 610 with respect to the 17 ticks 0T, 1T, . . . , 16T.

In some embodiments, in the case where the burst length BL=32 is set, as described with reference to FIG. 5, when the fuse boxes 1000 to 1016 includes the ticks 0T to 15T storing a first burst length BL=16 data set, the tick 16T storing the ECC with respect to the first burst length BL=16 data set, the ticks 17T to 32T storing a second burst length BL=16 data set, and the tick 33T storing the ECC with respect to the second burst length BL=16 data set, the fuse boxes 1000 to 1016 may require the anti-fuses 610 in twice the number of anti-fuses of FIG. 10, that is, 2*391=782 anti-fuses 610.

Figure 11:
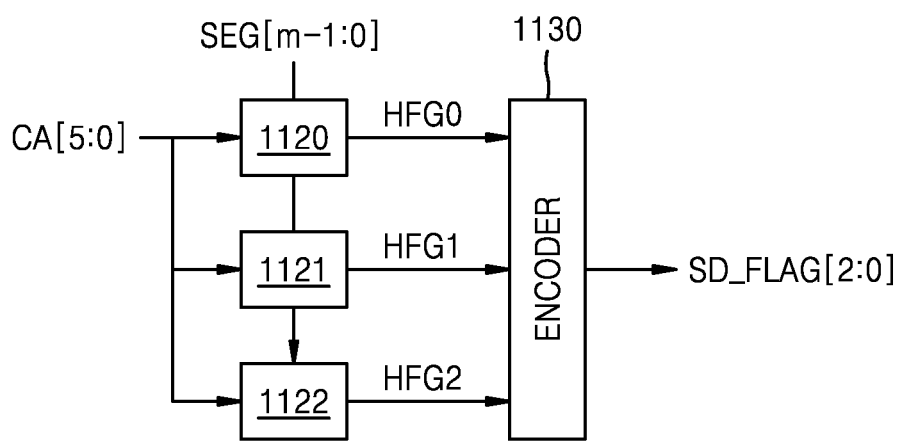
FIGS. 11 to 14 are diagrams illustrating a source-destination flag generation circuit according to an embodiment.
Figure 12:
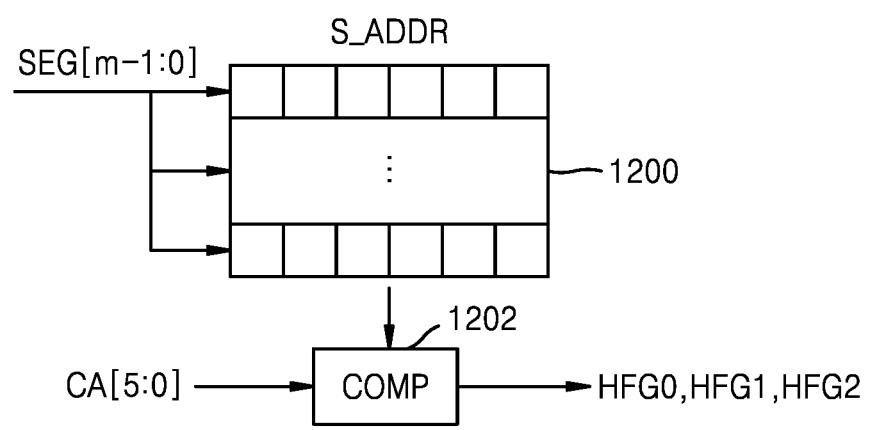

FIGS. 11 to 14 are diagrams illustrating the source-destination flag generation circuit 126 according to an embodiment. Hereinafter, subscripts (e.g., a in 126a and b in 126b) attached to the reference numerals are for distinguishing a plurality of circuits having the same function. An example in which the source-destination flag generation circuit 126a of FIG. 11 generates a source-destination flag signal SD_FLAG with respect to the source address S_ADDR of a failed column generated in a plurality of segments SEG[m−1:0] of FIG. 2 is described. FIG. 12 illustrates comparison circuits 1120, 1121, and 1122 of FIG. 11.

Referring to FIG. 11, the source-destination flag generation circuit 126a may include the comparison circuits 1120, 1121, and 1122, and an encoder 1130. The comparison circuits 1120, 1121, and 1122 may store the source address S_ADDR of the failed column generated in the plurality of segments SEG[m−1:0], and receive the column address CA[5:0]. Each of the comparison circuits 1120, 1121, and 1122 may, as shown in FIG. 12, include a fuse array 1200 storing the source address S_ADDR of the failed column generated in the plurality of segments SEG[m−1:0] and a comparator 1202.

In the fuse array 1200, for example, the source address S_ADDR may be stored as, for example, 6 bits with respect to each of the 16 segments SEG[0] to SEG[15]. The comparator 1202 may receive the column address CA[5:0] and the source address S_ADDR stored in the fuse array 1200, compare the column address CA[5:0] to the source address S_ADDR, and, as a result of comparison, when the column address CA[5:0] and the source address S_ADDR are the same, generate hit signals HFG0, HFG1, and HFG2. The hit signals HFG0, HFG1, and HFG2 of the comparison circuits 1120, 1121, and 1122 may be provided to the encoder 1130. The encoder 1130 of FIG. 11 may encode the hit signals HFG0, HFG1, and HFG2 of the comparison circuits 1120, 1121, and 1122 and generate the source-destination flag signal SD_FLAG. For example, the source-destination flag signal SD_FLAG may include 3 bits. A source-destination flag signal SD_FLAG[2:0] of 3 bits may have $2^{3=8}$ states, and 7 states excluding an initial state may be used for source-destination mapping.

Upon calculating the anti-fuse 610 used in the source-destination flag generation circuit 126a of FIG. 11, the source address S_ADDR of 6 bits is allocated for each of 16 segments SEG[0] to SEG[15] in the fuse array 1200 of FIG. 12 so that 16*6=96 anti-fuses 610 are used for unit source-destination mapping, and thus, 7*96=672 anti-fuses 610 may be used for source-destination mapping 7 times.

As described in FIG. 10, when the burst length BL=32 is set, the fuse boxes 1000 to 1016 of the repair address storage circuit 128c may use 782 anti-fuses 610. The source-destination flag generation circuit 126a of FIGS. 11 and 12 may use 672 anti-fuses 610. Accordingly, the repair address storage circuit 128c and the source-destination flag generation circuit 126a may use 782+672=1454 anti-fuses 610. It may be seen that the anti-fuse may be reduced by about −73% compared to the 5440 anti-fuses 610 used in FIG. 5.

Figure 13:
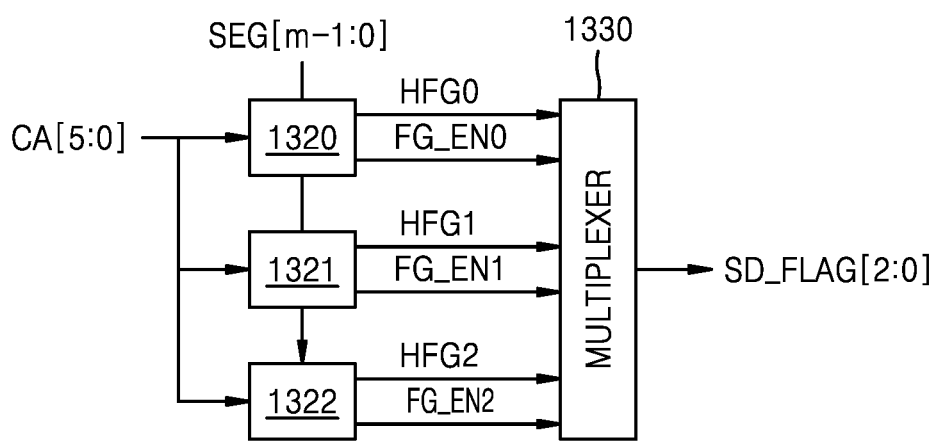
Figure 14:
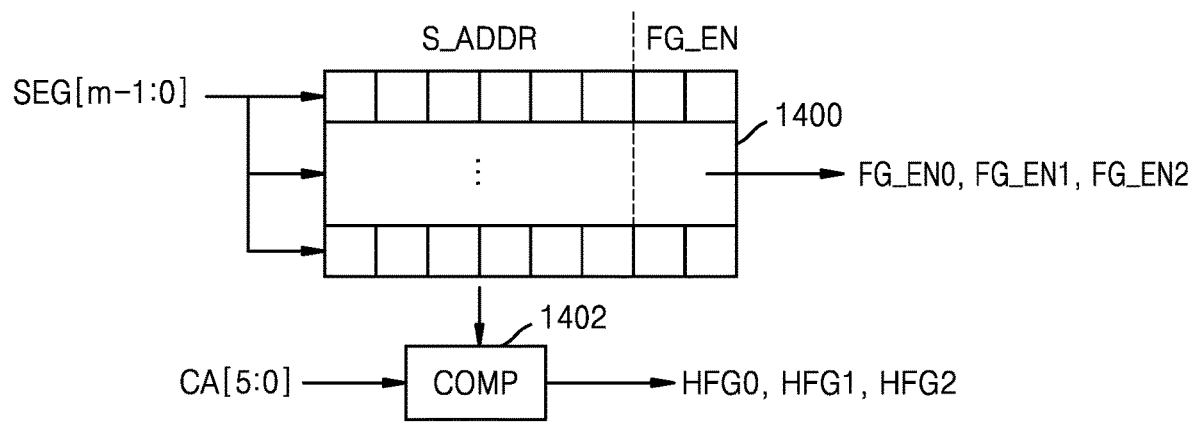

According to another embodiment, an example in which the source-destination flag generation circuit 126b of FIG. 13 generates the source destination flag signal SD_FLAG based on the source address S_ADDR and a flag signal FG_EN with respect to each of the plurality of segments SEG[m−1:0] is described. FIG. 14 illustrates comparison circuits 1320, 1321, and 1322 of FIG. 13.

Referring to FIG. 13, the source-destination flag generation circuit 126b may include the comparison circuits 1320, 1321, and 1322, and a multiplexer 1330. The comparison circuits 1320, 1321, and 1322 may store the source address S_ADDR of the plurality of segments SEG[m−1:0] and the flag signal FG_EN with respect to the source address S_ADDR, and receive the column address CA [5:0]. Each of the comparison circuits 1320, 1321, and 1322 may include, as shown in FIG. 14, a fuse array 1400 that stores the source address S_ADDR of the plurality of segments SEG[m−1:0] and the flag signal FG_EN and a comparator 1402.

In the fuse array 1400, for example, the source address S_ADDR may be stored as 6 bits with respect to each of the 16 segments SEG[0] to SEG[15] and the flag signal FG_EN may be stored as 2 bits. The comparator 1402 may receive the column address CA[5:0] and the source address S_ADDR stored in the fuse array 1200, compare the column address CA[5:0] to the source address S_ADDR, and as a result of comparison, when the column address CA[5:0] and the source address S_ADDR are the same, generate the hit signals HFG0, HFG1, and HFG2. In addition, the comparator 1402 may output the flag signal FG_EN of the source address S_ADDR related to the generated hit signals HFG0, HFG1, and HFG2 as flag enable signals FG_EN0, FG_EN1, and FG_EN2.

The hit signals HFG0, HFG1, and HFG2 and the flag enable signals FG_EN0, FG_EN1, and FG_EN2 of the comparison circuits 1420, 1421, and 1422 may be provided to the multiplexer 1330. The multiplexer 1330 of FIG. 13 may generate the source-destination flag signal SD_FLAG by combining the hit signals HFG0, HFG1, and HFG2 in response to the flag enable signals FG_EN0, FG_EN1, and FG_EN2. The source-destination flag signal SD_FLAG generated by the source-destination flag generation circuits 126a or 126b of FIG. 11 or 13 may be provided to a repair circuit 124b of FIG. 15.

Figure 15:
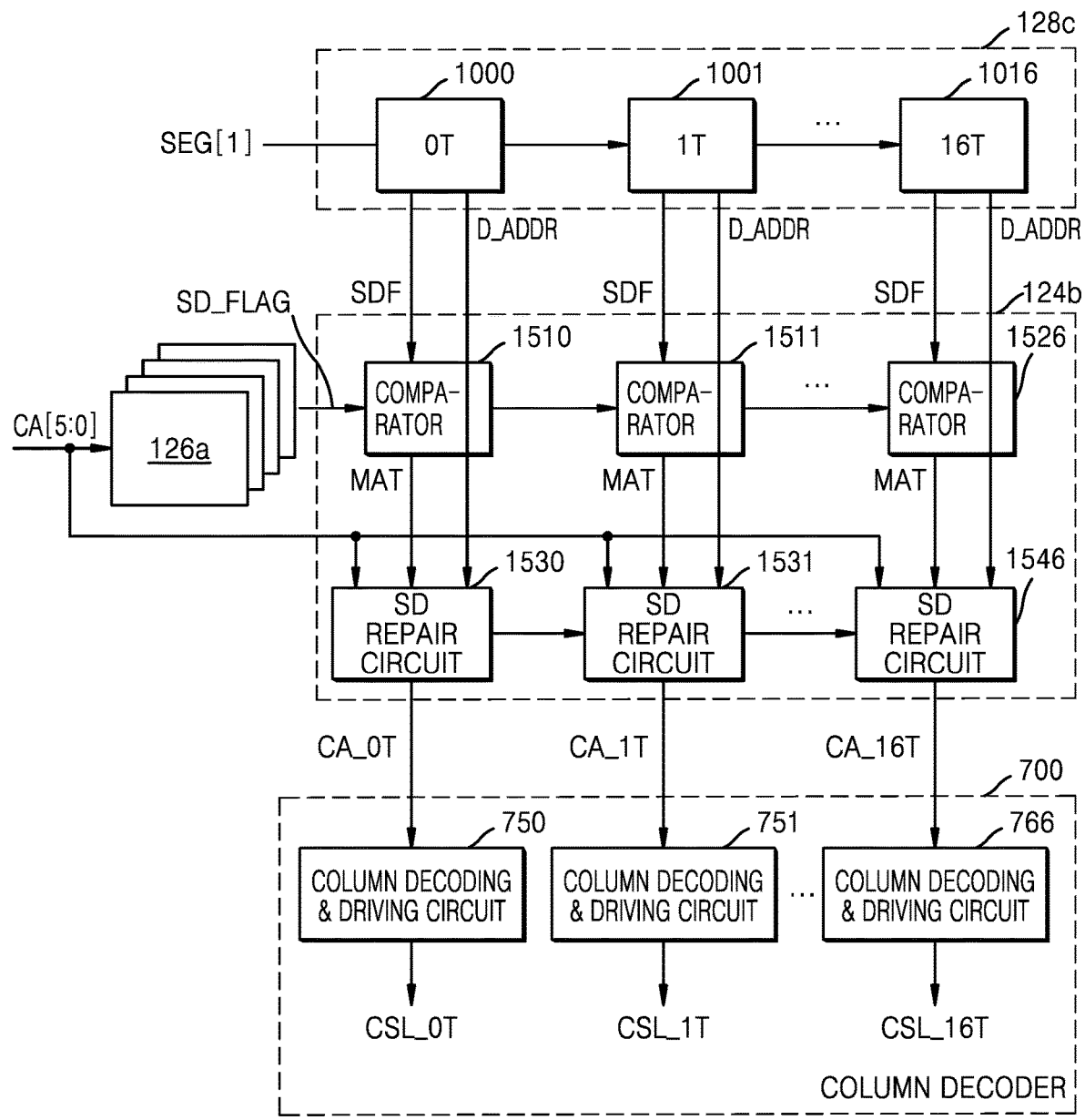
FIG. 15 is a diagram illustrating a repair circuit according to some embodiments.

FIG. 15 is a diagram illustrating the repair circuit 124b according to some embodiments. The repair circuit 124b of FIG. 15 may perform a repair operation in combination with the repair address storage circuit 128c of FIG. 10 and the source-destination flag generation circuit 126a of FIG. 11.

Referring to FIG. 15, the repair circuit 124b may receive the source-destination flag signal SD_FLAG output from the source-destination flag generation circuit 126a. The source-destination repair flag signal SDF with respect to the failed column 300 of the tick 0T shown in the first fail type A of FIG. 3 and the destination address D_ADDR may be stored in the fuse box 1000. The source-destination repair flag signal SDF with respect to a failed column of a corresponding tick and the destination address D_ADDR may also be stored in the remaining fuse boxes 1001 to 1016.

The repair circuit 124b may include comparators 1510, 1511, . . . , 1526 and source-destination repair circuits 1530, 1531, . . . , 1546 disposed to respectively correspond to the ticks 0T, 1T, . . . , 16T. For example, each of the comparators 1510, 1511, and 1526 may receive the source-destination flag signal SD_FLAG of the source-destination flag generation circuit 126a and the source-destination repair flag signal SDF stored in each of the fuse boxes 1000, 1001, and 1016. Each of the comparators 1510, 1511, and 1526 may compare the source-destination flag signal SD_FLAG and the source-destination repair flag signal SDF, and may activate or deactivate the match signal MAT according to a comparison result. Each of the comparators 1510, 1511, and 1526 may output the activated match signal MAT when the source-destination flag signal SD_FLAG and the source-destination repair flag signal SDF match each other, and output the deactivated match signal MAT when the source-destination flag signal SD_FLAG and the source-destination repair flag signal SDF do not match each other. For convenience of description, the source-destination repair flag signal SDF stored in each of the fuse boxes 1000, 1001, and 1016 of the repair address storage circuit 128c may be referred to as a first SD flag signal, and the source-destination flag signal SD_FLAG output from the source-destination flag generation circuit 126a may be referred to as the second SD flag signal.

For example, when the column address CA[5:0] addresses the failed column 300 of the tick 0T shown in the first fail type A of FIG. 3, the source-destination flag signal SD_FLAG generated by the source-destination flag generation circuit 126a may match the source-destination repair flag signal SDF stored in the fuse box 1000. The comparator 1510 may output the activated match signal MAT, and the comparators 1511 and 1526 may output the deactivated match signal MAT. The match signal MAT of the comparators 1510, 1511, and 1526 may be respectively provided to source-destination repair circuits 1530, 1531, and 1546.

Each of the source-destination repair circuits 1530, 1531, and 1546 may receive the match signal MAT, and perform a repair operation on the column address CA[5:0] according to whether the match signal MAT is activated. The source-destination repair circuit 1530 receiving the activated match signal MAT from the comparator 1510 may receive the column address CA[5:0] and the destination address D_ADDR stored in the first fuse box 1000, replace the column address CA[5:0] with the destination address D_ADDR, and output the destination address D_ADDR as a specified column address CA_0T of the tick 0T. Accordingly, the source-destination repair circuit 1530 may perform the repair operation on the column address CA[5:0] to the destination address D_ADDR.

On the other hand, the source-destination repair circuits 1531 and 1546 respectively receiving the deactivated match signal MAT from the comparators 1511 and 1526 do not perform the repair operation on the column address CA[5:0], and may output the column addresses CA[5:0] as the specified column addresses CA_1T and CA_16T of the tick 1T and the 15T ticks. The specified column addresses CA 0T, CA_1T, and CA_16T of the source-destination repair circuits 1530, 1531, and 1546 may be provided to the column decoder 700.

In the column decoder 700, the column decoding and driving circuit 750 may decode the destination address D_ADDR of the first fuse box 1000 and output the column selection signal CSL_0T which may correspond to the fourth column selection signal CSL3 of the tick ST in connection with the failed column 300 of the first fail type A of FIG. 3. The column selection signal CSL_0T may correspond to the third column selection signal CSL2 of the tick ST when the column address CA[5:0] is in connection with the failed column 301 of the second fail type B of FIG. 3.

As described above, the repair circuit 124b may repair the failed column 300 of the tick 0T to the redundancy column 333 of the tick ST, and repair the failed column 301 of the tick 0T to the redundancy column 332 of the tick ST, in combination with the repair address storage circuit 128c and the source-destination flag generation circuit 126a.

Figure 16:
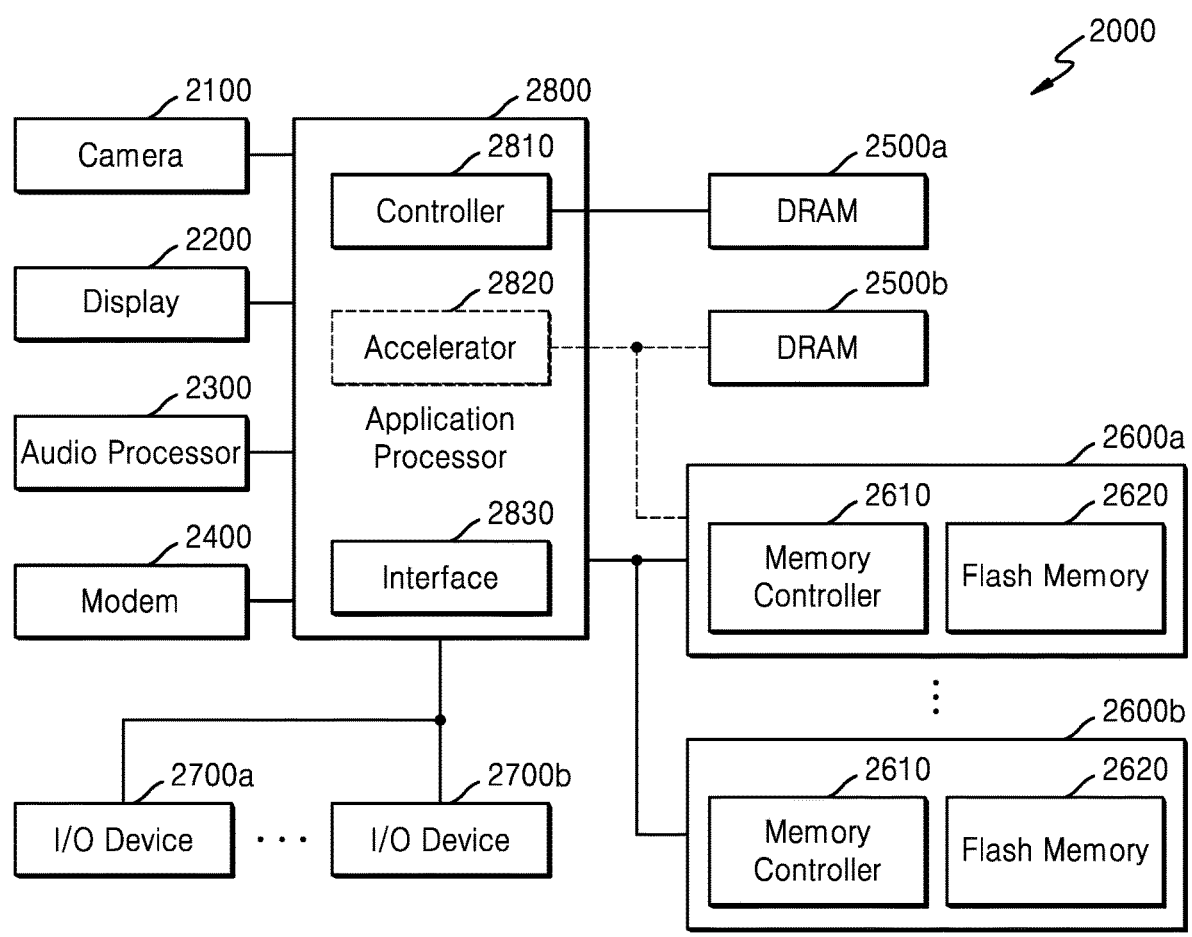
FIG. 16 is a block diagram illustrating a system including a flexible column repair circuit according to some embodiments.

FIG. 16 is a block diagram illustrating a system 2000 including a flexible column repair circuit according to some embodiments. Referring to FIG. 16, the system 2000 may include a camera 2100, a display 2200, an audio processor 2300, a modem 2400, DRAMs 2500a and 2500b, flash memories 2600a and 2600b, I/O devices 2700a and 2700b, and an application processor (AP) 1800. The system 2000 may be implemented as a laptop computer, a mobile phone, a smart phone, a tablet personal computer (PC), a wearable device, a healthcare device, or an Internet Of Things (IoT) device. Also, the system 2000 may be implemented as a server or a PC.

The camera 2100 may capture a still image or a moving image according to the control of a user, and may store the captured image/moving image data or transmit the same to the display 2200. The audio processor 2300 may process audio data included in the flash memory devices 2600a and 2600b or content of a network. The modem 2400 may modulate and transmit a signal to transmit/receive wired/wireless data, and a receiving end may demodulate the signal to restore the original signal. The I/O devices 2700a and 2700b may include devices providing digital input and/or output functions such as a Universal Serial Bus (USB) or storage, a digital camera, a Secure Digital (SD) card, a Digital Versatile Disc (DVD), a network adapter, a touch screen, etc.

The AP 2800 may control the overall operation of the system 2000. The AP 2800 may control the display 2200 to display part of the content stored in the flash memory devices 2600a and 2600b on the display 2200. When a user input is received through the I/O devices 2700a and 2700b, the AP 2800 may perform a control operation corresponding to the user input. The AP 2800 may include an accelerator block which is a dedicated circuit for an artificial intelligence (AI) data operation, or may include an accelerator chip 2820 separately from the AP 2800. The DRAM 2500b may be additionally mounted to the accelerator block or the accelerator chip 2820. The accelerator block or the accelerator chip 2820 is a function block that professionally performs a specific function of the AP 2800 and may include a GPU which is a function block professionally performing graphic data processing, a neural processing unit (NPU) which is a block professionally performing AI calculation and inference, and a data processing unit (DPU) which is a block professionally performing data transfer.

The system 2000 may include the plurality of DRAMs 2500*a* and 2500*b*. The AP 2800 may control the DRAMs 2500*a* and 2500*b* through a command and mode register (MRS) setting conforming to the Joint Electron Device Engineering Council (JEDEC) standard, or may communicate with the DRAMs 2500*a* and 2500*b* by setting a DRAM interface protocol to use company-specific functions such as low voltage/high speed/reliability and cyclic redundancy check (CRC)/ECC functions. For example, the AP 2800 may communicate with the DRAM 2500*a* through an interface conforming to the JEDEC standards such as LPDDR4, LPDDR5, and HBM, and the accelerator block or the accelerator chip 2820 may communicate with the DRAM 2500*a* by setting a new DRAM interface protocol so as to control the DRAM 2500*b* for accelerator having a higher bandwidth than that of the DRAM 2500*a*.

Only the DRAMs 2500*a* and 2500*b* are illustrated in FIG. 16, but the inventive concept is not limited thereto, and any memory, such as, for example, PRAM, SRAM, MRAM, RRAM, FRAM, or Hybrid RAM may be used as long as bandwidth, response speed, and voltage conditions of the AP 2800 or the accelerator chip 2820 are satisfied. The DRAMs 2500*a* and 2500*b* have relatively small latency and bandwidth compared to those of the I/O devices 2700*a* and 2700*b* or the flash memories 2600*a* and 2600*b*. The DRAMs 2500*a* and 2500*b* may be initialized when the system 2000 is powered on, loaded with operating system and application data, and used as temporary storage locations for the operating system and the application data or as execution spaces for various software codes.

In the DRAMs 2500*a* and 2500*b*, four arithmetic operations (e.g., addition, subtraction, multiplication, and division), vector calculations, address calculations, or Fast Fourier Transform (FFT) calculations may be performed. Also, a function for an operation used in an inference may be performed in the DRAMs 2500*a* and 2500*b*. Here, the inference may be performed in a deep learning algorithm using an artificial neural network. The deep learning algorithm may include a training operation for learning a model through various data and an inference operation for recognizing data with the trained model. As an embodiment, an image captured by a user through the camera 2100 is signal-processed and stored in the DRAM 2500*b*, and the accelerator block or the accelerator chip 2820 may perform an AI data operation for recognizing data by using data stored in the DRAM 2500*b* and a function used in the inference.

The system 2000 may include a plurality of storages or the plurality of flash memories 2600*a* and 2600*b* each having a larger capacity than the DRAMs 2500*a* and 2500*b*. The accelerator block or the accelerator chip 2820 may perform the training operation and the AI data calculation using the flash memory devices 2600*a* and 2600*b*. In an embodiment, the flash memories 2600*a* and 2600*b* may more efficiently perform the training operation and the inference AI data operation for AI data calculation, which are performed by the AP 2800 and/or the accelerator chip 2820 using a computing device provided in the memory controller 2610. The flash memories 2600*a* and 2600*b* may store images captured through the camera 2100 or data transmitted through a data network. For example, the flash memories 2600*a* and 2600*b* may store Augmented Reality/Virtual Reality content, High Definition (HD) content, or Ultra High Definition (UHD) content.

In system 2000, the DRAMs 2500*a* and 2500*b* may be configured to support the flexible column repair circuit described with reference to FIGS. 1 to 15. The flexible column repair circuit may firstly repair a first source address of a first failed column generated in each segment of the memory cell array 122 to a first destination address of a pass column in a first normal tick in which the first failed column is generated and then further repair the first destination address to a first redundancy column of a spare tick corresponding to the first destination address. The flexible column repair circuit may perform a repair operation of storing a first SD flag signal related to the first source address and a first destination address, generating a second SD flag signal based on a column address applied to the DRAMs 2500*a* and 2500*b* and the first source address, determining whether the first and second SD flag signals match with each other, and replacing the first failed column with the first redundancy column. The flexible column repair circuit may perform a repair operation of storing a first SD flag signal related to the first source address and the first destination address, generating the second SD flag signal, based on a column address applied to the memory device 120, the first source address, and a flag address related to the first source address, determining whether the first and second SD flag signals match with each other, and replacing the first failed column with the first redundancy column. The flexible column repair circuit may store the first SD flag signal indicating a mapping relationship between the first source address and the first destination address of the pass column in the first normal tick in which the first failed column is generated, store the second SD flag signal indicating that a second source address of a second failed column generated in the first normal tick is mapped to the first destination address, firstly repair the first and second source addresses to the first destination address, and then further repair the first and second source addresses respectively to the first and second redundancy columns of the spare tick corresponding to the first destination address.

While the inventive concept has been particularly shown and described with reference to embodiments thereof, it will be understood that various changes in form and details may be made therein without departing from the spirit and scope of the following claims.

What is claimed is:

1. A memory device, comprising:
   a memory cell array having a plurality of memory cells therein that span a plurality of rows, which are grouped into segments, and a plurality of columns, which are grouped into ticks, said ticks including normal ticks, and a spare tick that spans at least one redundancy column of memory cells in the memory cell array; and
   a repair circuit configured to repair a first source address of a first failed column in each of a plurality of the segments with a first destination address of a pass column in a first normal tick, using a first source-destination (SD) flag signal, and then further repair the first destination address of the pass column with a first redundancy column within the spare tick that corresponds to the first destination address;
   wherein the first SD flag signal indicates a first mapping relationship between the first source address and the first destination address, and a second mapping relationship between a second source address and the first destination address; and wherein the second source address is a second failed column generated in the first normal tick.

2. The memory device of claim 1, wherein the first source address of the first failed column and the first destination address of the pass column are both within the same tick.

3. The memory device of claim 1, wherein the repair circuit is configured to store the first source-destination (SD) flag signal related to the first source address and the first destination address, generate a second SD flag signal based on a column address applied to the memory device and the first source address, determine whether the first flag signal and the second SD flag signal match each other, and replace the first failed column with the first redundancy column.

4. The memory device of claim 3, wherein the repair circuit includes:

a repair address storage circuit configured to store the first SD flag signal; and a source-destination flag generation circuit configured to store the first source address of each of the plurality of segments, generate hit signals by comparing the first source address with a column address, and output the second SD flag signal by encoding the hit signals.

5. The memory device of claim 4, wherein the repair address storage circuit includes an anti-fuse array storing the first source address, the second source address, the first SD flag signal and the first destination address.

6. The memory device of claim 4, wherein the repair address storage circuit includes an anti-fuse array storing the first source address, the second source address, the first SD flag signal, the first destination address, and a segment flag signal indicating which segment corresponds to the first SD flag signal and the first destination address.

7. The memory device of claim 4, wherein the source-destination flag generation circuit includes an anti-fuse array storing the first source address and the second source address.

8. A method of operating a memory device, comprising:

repairing a column of memory cells in a memory cell array having a plurality of rows grouped into multiple segments and a plurality of columns grouped into multiple normal ticks and a spare tick that spans at least one redundancy column of memory cells within the memory cell array, by performing a source-destination repair operation that includes:

replacing a first failed column of memory cells at a first source address within a first one of the normal ticks with a pass column at a first destination address within the first one of the normal ticks, replacing a second failed column of memory cells at a second source address within the first one of the normal ticks with a pass column at the first destination address within the first one of the normal ticks based on a first source-destination (SD) flag signal, which indicates a first mapping relationship between the first source address and the first destination address; and then further repairing the pass column at the first destination address with a first redundancy column within the spare tick.

9. The method of claim 8, further comprising:

replacing a failed column of memory cells within a second one of the normal ticks with a second redundancy column within the spare tick.

10. The method of claim 9, wherein said replacing a failed column of memory cells within a second one of the normal ticks is performed without using a source-destination repair operation.

11. A memory device for accessing data corresponding to a burst length (BL), the memory device comprising:

a memory cell array comprising a plurality of memory cells disposed at intersections of a plurality of rows and a plurality of columns, wherein the memory cell array divides the plurality of rows into segments and the plurality of columns into ticks, wherein the ticks comprise normal ticks corresponding to burst data of the BL in each of the segments and a spare tick repairing a failed column of the normal ticks with a redundancy column; and a repair circuit configured to firstly repair a first source address of a first failed column generated in each of the segments with a first destination address of a pass column in a first normal tick in which the first failed column is generated, and then further repair the first destination address to a first redundancy column of the spare tick corresponding to the first destination address;

wherein the repair circuit performs a repair operation of storing a first source-destination (SD) flag signal related to the first source address and the first destination address, generating a second SD flag signal based on a column address applied to the memory device and the first source address, determining whether the first and second SD flag signals match with each other, and replacing the first failed column with the first redundancy column;

wherein the first SD flag signal indicates a first mapping relationship between the first source address and the first destination address and a second mapping relationship between a second source address and the first destination address; and wherein the second source address is a second failed column generated in the first normal tick.

12. The memory device of claim 11, wherein the repair circuit includes:

a repair address storage circuit storing the first source address, the second source address, and the first SD flag signal and the first destination address, with respect to each of the normal ticks of each of the segments; and a source-destination flag generation circuit storing the first source address of each of the segments, generating first hit signals by comparing the first source address of each of the segments with the column address, and outputting the second SD flag signal by encoding the first hit signals.

13. The memory device of claim 12, wherein the source-destination flag generation circuit stores the second source address of each of the segments, generates second hit signals by comparing the second source address of each of the segments with the column address, and outputs the second SD flag signal by encoding the second hit signals.

14. The memory device of claim 12, wherein the repair address storage circuit includes an anti-fuse array storing the first source address, the second source address, the first SD flag signal, the first destination address, and a segment flag signal indicating which segment corresponds to the first SD flag signal and the first destination address.

15. The memory device of claim 12, wherein the source-destination flag generation circuit includes an anti-fuse array storing the first source address and the second source address.

16. The memory device of claim 12, wherein the repair circuit further includes:
- a comparison circuit configured to receive the first SD flag signal with respect to each of the normal ticks of each of the segments, compare the first SD flag signal with the second SD flag signal, and output a match signal, the match signal being activated when the first SD flag signal and the second SD flag signal match with each other; and
- a source-destination repair circuit configured to receive the column address and the first destination address with respect to each of the normal ticks of each of the segments, and output the first destination address in response to the activated match signal to perform the repair operation.

17. The memory device of claim 16, further comprising a column decoder configured to access the first redundancy column of the spare tick by decoding the first destination address.

18. The memory device of claim 17, wherein the source-destination repair circuit outputs the column address to the column decoder when the match signal is deactivated, and the column decoder decodes the column address.

19. The memory device of claim 11, wherein the normal ticks further include a tick storing an error correction code (ECC) with respect to a burst data set of the BL.

20. The memory device of claim 11, wherein the BL is set to 16 or 32 in a mode register set of the memory device.

* * * * *